(12) United States Patent
Kizilyalli et al.

(10) Patent No.: US 6,339,246 B1
(45) Date of Patent: Jan. 15, 2002

(54) TUNGSTEN SILICIDE NITRIDE AS AN ELECTRODE FOR TANTALUM PENTOXIDE DEVICES

(76) Inventors: Isik C. Kizilyalli, 6535 Doubletrace La., Orlando, FL (US) 32819; Sailesh Mansinh Merchant, 8214 Vineland Oaks Blvd., Orlando, FL (US) 32855; Pradip Kumar Roy, 7706 Hidden Ivey Ct., Orlando, FL (US) 32819

( * ) Notice: Subject to any disclaimer, the term of this patent is extended or adjusted under 35 U.S.C. 154(b) by 0 days.

(21) Appl. No.: 09/209,787

(22) Filed: Dec. 11, 1998

(51) Int. Cl.$^7$ ................................................ H01L 29/76
(52) U.S. Cl. ........................................ 257/412; 257/410
(58) Field of Search ........................ 257/751, 410, 257/411, 412

(56) References Cited

U.S. PATENT DOCUMENTS 5,528,068 A * 6/1996 Ohmi ........................ 257/410
5,903,053 A * 5/1999 Iijima et al. ................ 257/751

OTHER PUBLICATIONS

"Stacked High-ε Gate Dielectric For Gigascale Integration Of Metal–Oxide–Semicondcutor Technologies", *Applied Physics Letters* vol. 72, No. 22, Jun. 1, 1998, P.K. Roy and I.C. Kizilyalli.

"Leakage Current Comparison Between Ultra–Thin $Ta_2O_5$ Films And Conventional Gate Dielectrics", *IEEE Electron Device Letters* vol. 19, No. 9, Sep. 1998, Qiang Lu et al.

* cited by examiner

*Primary Examiner*—Mark V. Prenty

(57) ABSTRACT

The specification describes a process for making gate electrodes for silicon MOS transistor devices having tantalum pentoxide gate dielectrics. The gate electrode includes a layer of tungsten silicide, and, preferably a layer of tungsten suicide nitride. The tungsten silicide nitride/tungsten silicide reduces oxygen depletion effects in the tantalum pentoxide. The layers are preferably formed in situ in a PVD apparatus.

6 Claims, 2 Drawing Sheets

Figure 1:
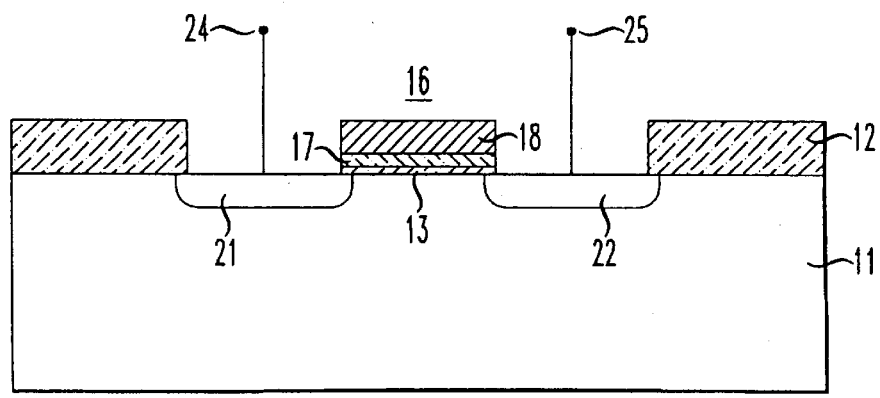

TUNGSTEN SILICIDE NITRIDE AS AN ELECTRODE FOR TANTALUM PENTOXIDE DEVICES

FIELD OF THE INVENTION

The invention relates to methods for fabricating field effect devices and more particularly to methods for forming gate electrodes for silicon MOS transistors.

BACKGROUND OF THE INVENTION

Since the commercial inception of field effect transistors in the early 1970s, the gate dielectric has been silicon dioxide, and more recently, silicon oxynitride. The electrode for these devices has usually been polysilicon. The polysilicon is normally dual-doped and topped with a dopant diffusion barrier of titanium nitride. Recently, it has been proposed that tantalum pentoxide be substituted for silicon dioxide as a dielectric. See C. Hu, Elec. Dev. Letters, September 1998, p. 341–42, incorporated herein as if set forth in its entirety. However, tantalum pentoxide leakage current increases upon elevated temperature processing as it loses oxygen. Annealing in an oxidizing gas such as $O_2$ or $N_2O$ normally reverses this degradation. Titanium nitride is an ineffective barrier to this oxygen loss, especially above about 600C, as titanium nitride starts to decompose at about that temperature. Thus there is a need for an improved gate electrode material in high-density silicon MOS transistor technology when tantalum pentoxide is used as the gate dielectric.

SUMMARY OF THE INVENTION

We have developed an improved MOS gate structure for silicon MOS transistor IC devices with tantalum pentoxide or stacked tantalum pentoxide dielectrics. The structure includes a two level composite of WSi and WSiN and a three level composite of WSi/WSiN/WSi. The tungsten silicide layer provides electrical conductivity for the gate structure, and the tungsten silicon nitride layer is an effective barrier to oxygen diffusion, especially at elevated temperatures to about 800C. This gate structure suffers none of the elevated temperature problems of titanium nitride. A useful feature of the improved structure is that it can be manufactured in a single deposition tool with convenient in-situ processing of all layers of the composite.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures:

FIG. 1 is a schematic view of the gate region of a typical field effect transistor showing a composite gate electrode made according to the invention;

FIG. 2 is a schematic diagram of a physical vapor deposition (PVD) apparatus useful for implementing the invention; and FIGS. 3–5 are schematic representations of a process sequence for forming the composite gate electrode of FIG. 1.

DETAILED DESCRIPTION

With reference to FIG. 1, a silicon substrate 11 is shown with field dielectric 12, and tantalum pentoxide gate dielectric 13 formed by metal-organic chemical vapor deposition (MOCVD). In the preferred application of the invention, gate dielectric layer is less than about 10 nm preferably less than about 6 nm. This is the dimensional regime where oxygen depletion problems are most severe with tantalum pentoxide dielectrics. While not wishing to be held to any theories, oxygen loss may create substoichiometric tantalum oxide, the lost oxygen leaving hole carriers, which would reduce the insulation properties of the tantalum pentoxide and increase leakage current. Particularly preferred is the use of a stacked tantalum pentoxide dielectric system wherein silicon dioxide is first formed on silicon, followed by tantalum pentoxide, followed by another layer of silicon dioxide, respective thicknesses are about 0.8 to about 2 nm, about 3 to about 30 nm and about 0.5 to about 2 nm. Stacked tantalum pentoxide systems are described by P. K. Roy et al. in Appl. Phys. Letts., Vol. 72, No. 22, Jun. 1, 1998, pp. 2835–37, incorporated herein by reference as if set forth in full.

Next in the process sequence is the formation of the composite gate electrode 16. The gate electrode is illustrated with a single solid outline to convey the fact that in the preferred layered structure of the invention, the materials transition from one to another without a distinct break, and the entire composite gate electrode is made in essentially a single processing operation. The composite gate electrode comprises a tungsten silicide nitride layer, $WSi_xN_y$ 17 as an oxygen diffusion barrier deposited on the gate dielectric 13, and a tungsten silicide, $WSi_x$, layer 18 deposited on the tungsten silicide nitride layer 17. Other electrical conductor materials, such as aluminum and copper, may be deposited in addition to, or instead of, the $WSi_x$, which is, however, preferred. In forming the composite gate electrode layer, all layers are deposited in one sequential operation, as will later be described.

In another embodiment, an adhesion layer of WSi is first deposited on stacked tantalum pentoxide to form a three layer composite of WSi/WSiN/Wsi having typical respective thickness of about 1 to about 2 nm, about 5 to about 30 nm and about 10 to about 120 nm.

The composite stack may be deposited as a functionally gradient material, wherein the nitrogen and silicon content vary smoothly with respect to the tungsten, rather than having sharply defined boundaries between the layers.

The composite gate electrode is then defined by, e.g., conventional RIE (reactive ion etching). The dielectric 13 is shown in FIG. 1 as etched from areas above the source drain regions (using the composite gate electrode 16 as a mask). The source and drain 21 and 22 are then formed by conventional ion implantation. Alternatively, the dielectric layer can remain in place and the source and drain implants made through the dielectric layer using the composite gate electrode as an implant mask. For p-channel devices the dopant is boron, and for n-channel devices the dopant is typically arsenic. In some prior art processes, the gate electrode is exposed during the implant step and the impurity is implanted into the exposed gate electrode to increase gate conductivity. However, using the composite material of the invention doping of the gate is not needed, and may be avoided.

After formation of the source/drain, the interlevel dielectric is deposited, the source/drain contact windows are opened in the interlevel dielectric via lithography, contacts to the gate electrode & source/drain regions are fabricated using tungsten or aluminum plugs or studs. An interconnect metal level is then deposited (not shown) and patterned, and another interlevel dielectric is deposited (not shown). Optionally a third interconnect level (not shown) can be formed. The source and drain contacts are shown schematically at 24 and 25 in FIG. 1. This last series of steps is standard in IC technology and is not illustrated here.

An important feature of the process in the context of the invention is the formation of the multilayer gate electrode. This will be described in more detail in conjunction with FIGS. 2–5.

The preferred deposition process for the layers forming the multilayer gate electrode is physical vapor deposition (PVD), i.e. sputtering. The tungsten suicide layers are sputtered from a tungsten suicide target in an inert gas atmosphere at reduced pressure. Reactive sputtering in nitrogen and argon gas forms the nitride layer. Nitrogen alone may be used. The multilayer deposition steps are preferably performed sequentially in the same deposition apparatus, without breaking the vacuum in the PVD apparatus. For the purpose of this description, the layers formed in this manner are defined as formed "in situ".

Figure 2:
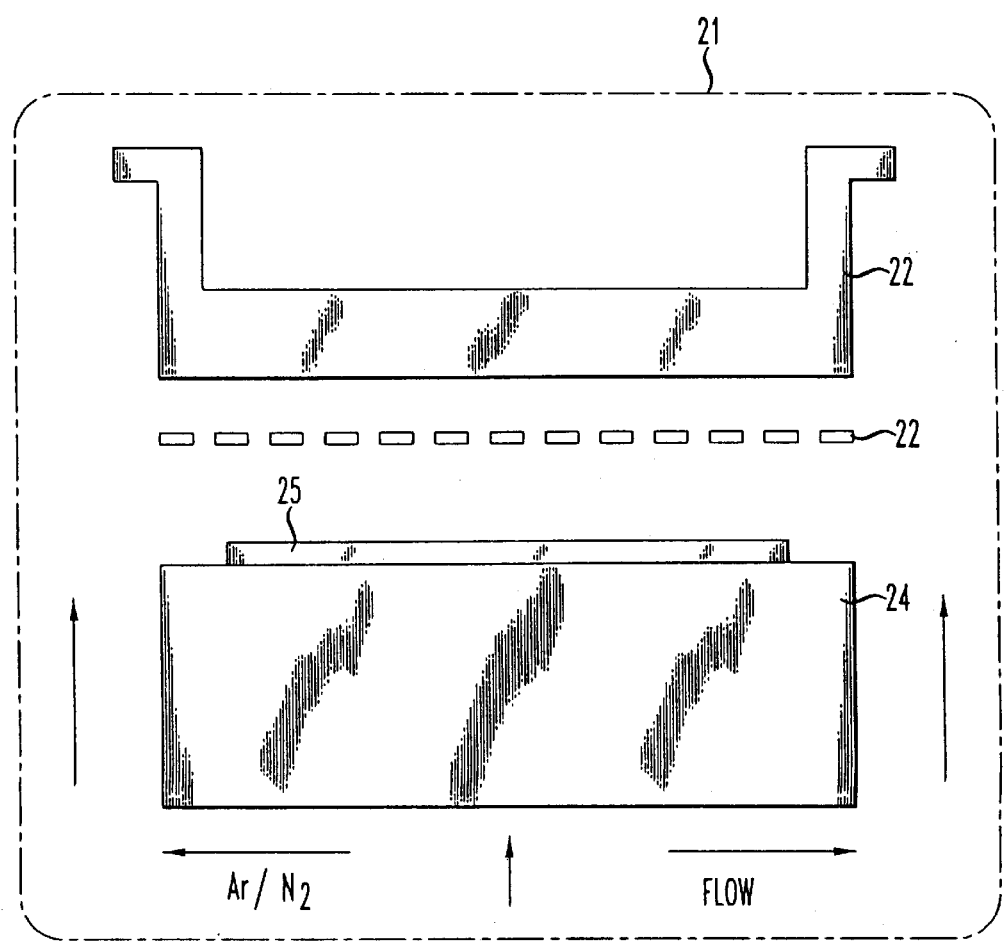

The PVD process itself is conventional and may be performed in any suitable PVD apparatus. A schematic representation of a PVD apparatus is shown in FIG. 2. Vacuum chamber 21 houses the sputtering target 29, optional collimator 22 (gases may be introduced into the chamber either from the top or the bottom), and the substrate heater 24, which supports the wafer 25. The gas flow is indicated in the figure and comprises argon for sputtering the metal layers, and argon plus nitrogen for reactively sputtering the nitride layer.

Figure 3:
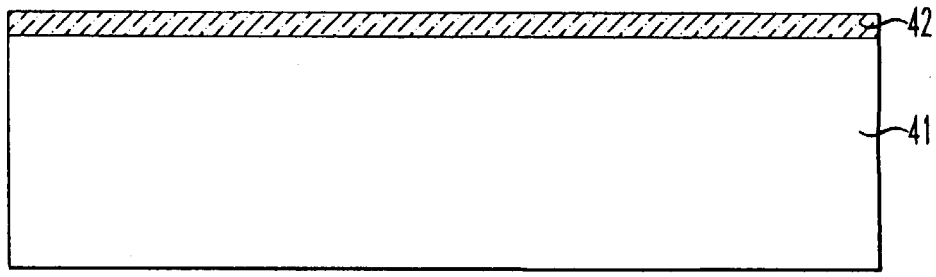

Referring to FIG. 3, the silicon substrate is shown at 41 with tantalum pentoxide gate dielectric layer 42 formed thereon. A resistively heated susceptor, or heater or use of backside heating with argon (not shown) may be used to raise the wafer temperature. This view is of the gate/channel region of the MOS device so the field dielectric does not appear. The gate electrode layers are next deposited.

Figure 4:
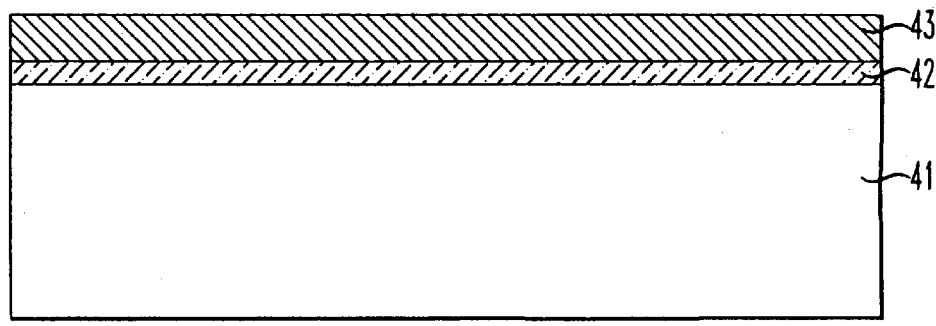

With reference to FIG. 4, the barrier layer 43 is sputter deposited on layer 42, preferably in situ in a PVD reactor by adding nitrogen to the PVD reactor. The barrier layer is $WSi_xN_y$, and is a key ingredient in the multilayer gate electrode stack for preventing oxygen loss via diffusion from the tantalum pentoxide region as described earlier. The preferred nitrogen flow is between about 5 and about 55 sccm, with the argon carrier gas flow at about 40 to about 60 sccm. The silicide/nitride material of layer 43 is typically a high resistivity material. Controlling the nitrogen flow rate and the resulting composition of the layer can control the sheet resistance of this material. The preferred compositional range for the $WSi_xN_y$ barrier layer is about 5 to about 30% N, about 40 to about 60% Si, balance W. The preferred thickness of layer 43 is in the range of about 50 to about 300 Å. The nitride may be deposited in either the nitrided or the non-nitrided mode depending on the nitrogen flow rate. These deposition modes are known in the art.

Figure 5:
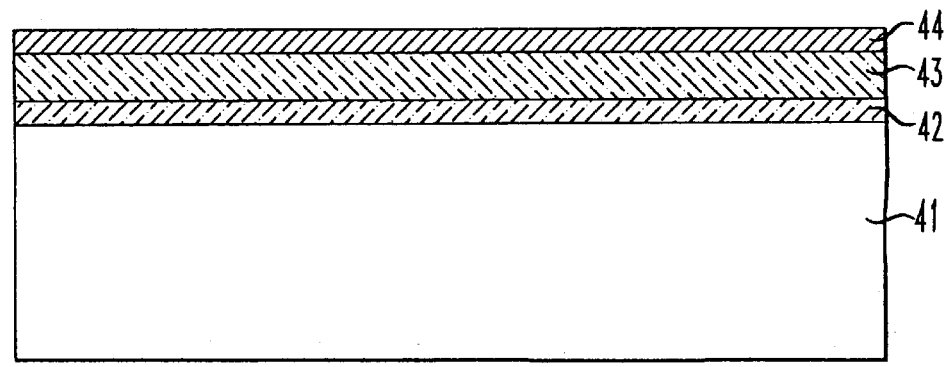

The tungsten silicide layer, shown at 44 in FIG. 5, is deposited in the PVD reactor using a $WSi_x$ target with a Si to W ratio greater than about 2. Preferably the Si/W ratio is greater than about 2.5, and the most effective range is about 2.5 to about 2.9. Layer 44 is deposited in an argon atmosphere at a pressure in the range of about 2 to about 6 mTorr and a temperature in the range of about 25 to about 400° C. The thickness of layer 44 is in the range of about 100 to about 1200 Å, preferably about 600 to about 800 Å.

Layers 43–44 can also be deposited by other techniques, such as CVD. For example, the silicide can be formed using dichlorosilane, or similar precursor, and the silicide nitride layer formed by the addition of gases that provide a source of nitrogen. The deposition is then completed by shutting off the nitrogen source to form the top silicide layer.

Those skilled in the art will recognize the advantage of using the multilayer gate electrode of the invention. The multilayer structure of silicide-nitride to silicide, constitutes a compositionally graded stack that allows stress accommodation. The ease of fabrication of such a structure is evident by the fact that the whole gate electrode stack can be deposited in one single chamber without the cost of depositing poly-Si in a separate tool as in the prior art. Moreover, the $WSi_xN_y$ serves as an excellent barrier for oxygen diffusion out of the tantalum pentoxide when the device is subject to thermal treatments while it is being fabricated. Such a barrier is not available in the poly-Si or titanium nitride stacks used in the prior art.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. A field effect transistor comprising a source, a gate and a drain, wherein the gate comprises a multilayer gate electrode comprising a tantalum pentoxide layer, a tungsten silicide nitride layer and a tungsten suicide layer, wherein the thickness of the multilayer gate electrode is in the range of about 50 to about 200 nm.

2. A field effect transistor comprising a source, a gate and a drain, wherein the gate comprises a multilayer gate electrode comprising a tantalum pentoxide layer, a tungsten suicide nitride layer and a tungsten suicide layer, wherein the tungsten silicide nitride layer comprises about 5 to about 30% N, about 40 to about 60% Si, balance W.

3. A field effect transistor comprising a source, a gate and a drain, wherein the gate comprises a multilayer gate electrode comprising a tantalum pentoxide layer, a tungsten silicide nitride layer and a tungsten silicide layer, wherein the ratio of silicon to tungsten in the tungsten silicide layer is greater than about 2.5.

4. A field effect transistor comprising a source, a gate and a drain, wherein the gate comprises a multilayer gate electrode comprising a tantalum pentoxide layer, a tungsten silicide nitride layer and a tungsten silicide layer, wherein the ratio of silicon to tungsten in the tungsten suicide layer is in the range of about 2.5 about 2.9.

5. A field effect transistor comprising a source, a gate and a drain, wherein the gate comprises a multilayer gate electrode comprising a tantalum pentoxide layer, a tungsten silicide nitride layer and a tungsten silicide layer, wherein the thickness of the tungsten silicide nitride layer is in the range of about 5 to about 30 nm.

6. A field effect transistor comprising a source, a gate and a drain, wherein the gate comprises a multilayer gate electrode comprising a tantalum pentoxide layer, a tungsten silicide nitride layer and a tungsten silicide layer, wherein the thickness of the tungsten silicide layer is in the range of about 10 nm to about 120 nm.

* * * * *